United States Patent
Rajendran et al.

(10) Patent No.: US 9,893,702 B2
(45) Date of Patent: Feb. 13, 2018

(54) NOTCH FILTER WITH DIFFERENTIAL SPLIT INDUCTOR

(71) Applicant: QUALCOMM Incorporated, San Diego, CA (US)

(72) Inventors: Gireesh Rajendran, Bangalore (IN); Alok Prakash Joshi, Bangalore (IN); Apu Sivadas, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 81 days.

(21) Appl. No.: 14/810,166

(22) Filed: Jul. 27, 2015

(65) Prior Publication Data

US 2017/0033757 A1 Feb. 2, 2017

(51) Int. Cl.
| | |
|---|---|
| *H03H 7/01* | (2006.01) |
| *H01F 38/14* | (2006.01) |
| *H03F 3/191* | (2006.01) |
| *H03F 3/195* | (2006.01) |
| *H03H 11/52* | (2006.01) |

(52) U.S. Cl.
CPC ........... *H03H 7/0115* (2013.01); *H01F 38/14* (2013.01); *H03F 3/191* (2013.01); *H03F 3/195* (2013.01); *H03H 7/0153* (2013.01); *H01F 2038/146* (2013.01); *H03H 11/52* (2013.01); *H03H 2007/013* (2013.01)

(58) Field of Classification Search
CPC ...... H03H 7/0115; H03H 7/09; H03H 7/0153; H03H 2007/013
USPC ........... 333/4, 175, 186, 188, 174, 176, 185; 361/271; 336/200, 147, 180
See application file for complete search history.

(56) References Cited

U.S. PATENT DOCUMENTS

| | | | | |
|---|---|---|---|---|
| 5,495,404 A | * | 2/1996 | Stephens | H02M 7/538 363/132 |
| 6,307,458 B1 | * | 10/2001 | Zhang | H01F 17/0006 336/200 |
| 6,819,193 B2 | | 11/2004 | Gutierrez | |
| 8,502,596 B1 | | 8/2013 | Kaunisto et al. | |
| 8,742,859 B2 | | 6/2014 | Narathong et al. | |
| 8,810,322 B2 | | 8/2014 | Rangarajan et al. | |
| 9,008,601 B2 | | 4/2015 | Murphy et al. | |
| 2005/0212604 A1 | * | 9/2005 | Cyr | H01L 24/48 331/16 |

(Continued)

FOREIGN PATENT DOCUMENTS

| | | |
|---|---|---|
| CN | 203482306 U | 3/2014 |
| EP | 2662870 A1 | 11/2013 |

OTHER PUBLICATIONS

International Search Report and Written Opinion—PCT/US2016/040573—ISA/EPO—dated Dec. 20, 2016.

(Continued)

*Primary Examiner* — Rakesh Patel
(74) *Attorney, Agent, or Firm* — Paradice and Li LLP/Qualcomm (57) ABSTRACT

A notch filter including an inductor-capacitor tuning circuit is disclosed. The inductor-capacitor tuning circuit may determine a frequency response of the notch filter in accordance with an associated resonant frequency. In some exemplary embodiments, the inductor-capacitor circuit may include a differential inductor divided at a symmetry point and a variable capacitor coupled to the differential inductor at the symmetry point.

18 Claims, 8 Drawing Sheets

(56) References Cited

U.S. PATENT DOCUMENTS

| | | |
|---|---|---|
| 2009/0302958 A1 | 12/2009 | Sakurai et al. |
| 2012/0169428 A1 | 7/2012 | Maarefi et al. |
| 2012/0293265 A1 | 11/2012 | Heikkinen et al. |
| 2014/0185661 A1 | 7/2014 | Chang et al. |
| 2014/0210571 A1* | 7/2014 | Andersson ............... H01F 27/42 333/177 |
| 2014/0354348 A1* | 12/2014 | Gupta ....................... G05F 3/16 327/535 |

OTHER PUBLICATIONS

Krishna M.C., et al., "A 6 pJ/bit Transmitter Front End in 130 nm CMOS Technology for Wireless Interconnect," 2015 IEEE 16th Annual Wireless and Microwave Technology Conference (WAMICON), IEEE, Apr. 13, 2015 (Apr. 13, 2015), pp. 1-3, XP032783508, DOI: 10.1109/WAMICON.2015.7120394 [retrieved on Jun. 9, 2015].
Partial International Search Report—PCT/US2016/040573—ISA/EPO—dated Oct. 18, 2016.

* cited by examiner

NOTCH FILTER WITH DIFFERENTIAL SPLIT INDUCTOR

TECHNICAL FIELD

The exemplary embodiments relate generally to filters, and specifically to notch filters with differential split inductors.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and transmit the transmit RF signal via an antenna to another device such as, for example, a base station. For data reception, the receiver may obtain a received RF signal via the antenna and may amplify and process the received RF signal to recover data sent by the other device.

Amplification of RF signals may be provided by one or more amplifiers. In some exemplary embodiments, the amplified RF signal may include one or more undesired frequency bands. For example, an amplified oscillator signal may include one or more harmonic signals that may interfere with and/or impede functionality of circuits included within the transmitter and/or the receiver of the wireless device. Therefore, filtering the amplified oscillator signal to suppress and/or attenuate the undesired frequency bands may improve performance of the wireless device.

Thus, there is a need to control the amplification of RF signals and attenuate one or more frequency bands that may be included with the amplified RF signals.

BRIEF DESCRIPTION OF THE DRAWINGS

The exemplary embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the exemplary embodiments. However, it will be apparent to one skilled in the art that these specific details may not be required to practice the exemplary embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The exemplary embodiments are not to be construed as limited to specific examples described herein but rather to include within their scope all exemplary embodiments defined by the appended claims.

In addition, the detailed description set forth below in connection with the appended drawings is intended as a description of exemplary embodiments of the present disclosure and is not intended to represent the only exemplary embodiments in which the present disclosure may be practiced. The term "exemplary" used throughout this description means "serving as an example, instance, or illustration," and should not necessarily be construed as preferred or advantageous over other exemplary embodiments.

Further, combinations such as "at least one of A, B, or C," "at least one of A, B, and C," and "at least A or B or C or a combination thereof" include any combination of A, B, and/or C, and may include multiples of A, multiples of B, or multiples of C. Specifically, combinations such as "at least A or B or C or a combination thereof," "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C.

Figure 1:
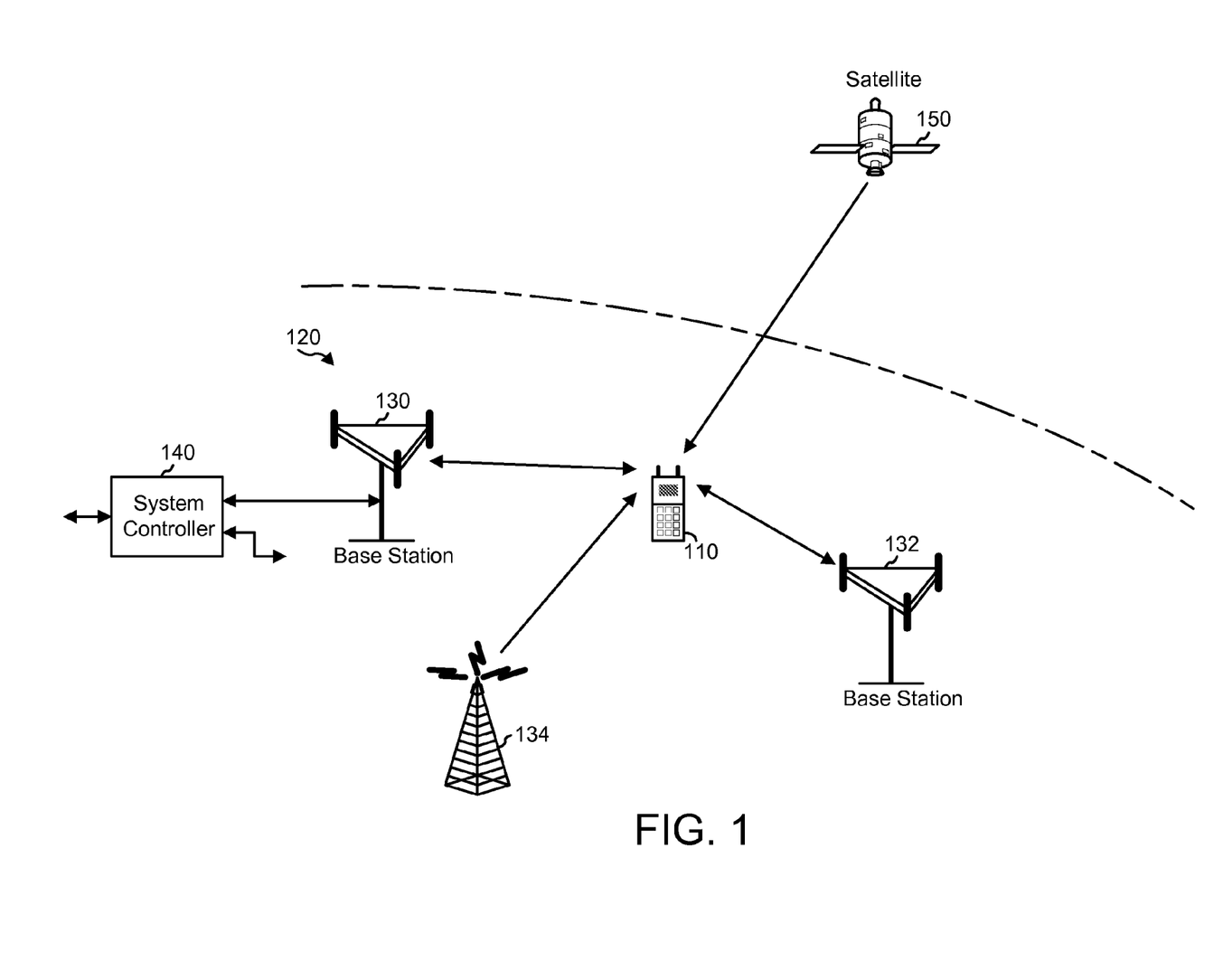
FIG. 1 shows a wireless device communicating with a wireless communication system, in accordance with some exemplary embodiments.

FIG. 1 shows a wireless device 110 communicating with a wireless communication system 120, in accordance with some exemplary embodiments. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Figure 2:
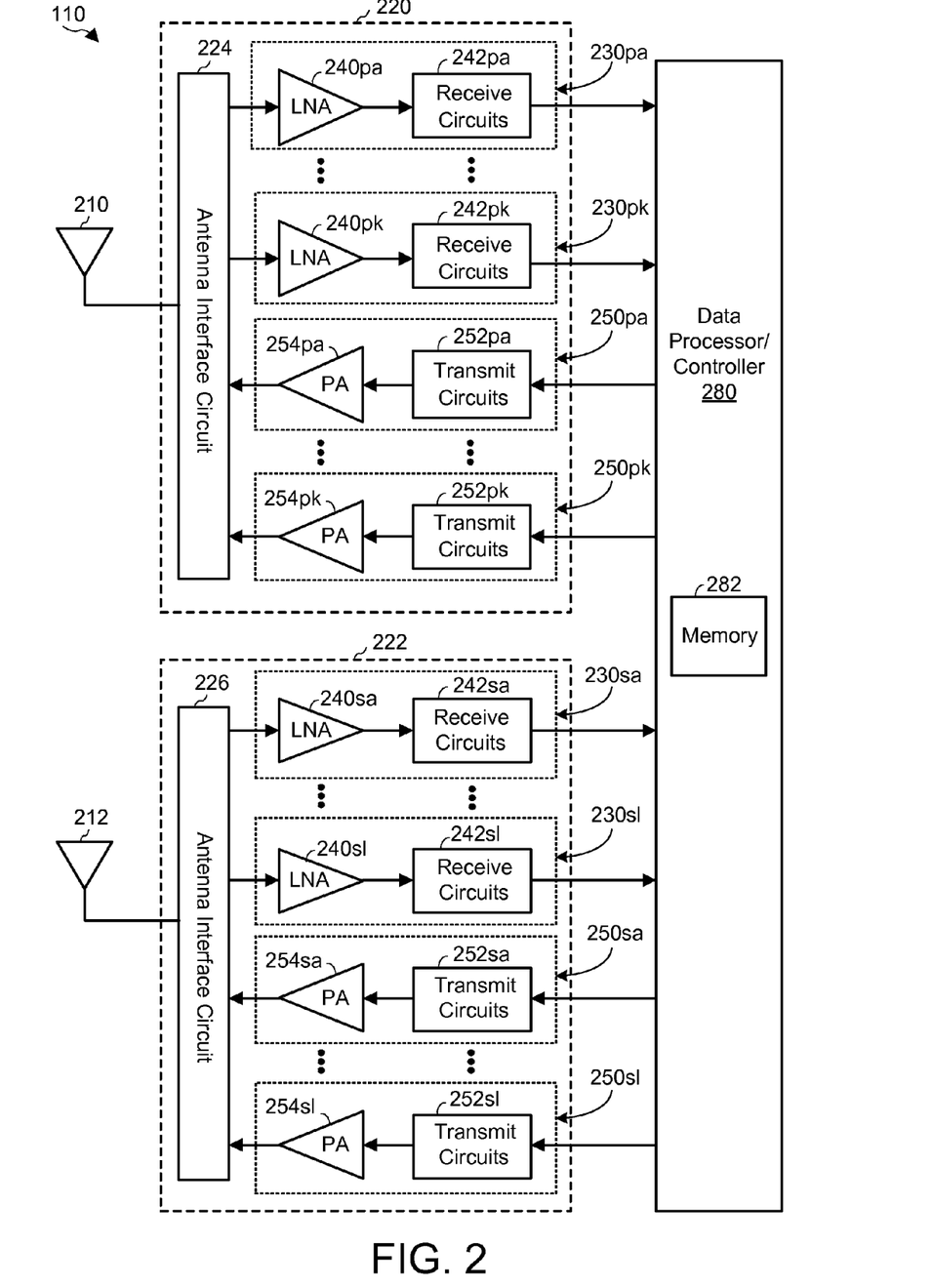
FIG. 2 shows an exemplary design of a receiver and a transmitter of FIG. 1.

FIG. 2 shows a block diagram of an exemplary design of wireless device 110 in FIG. 1. In this exemplary design, wireless device 110 includes a primary transceiver 220 coupled to a primary antenna 210, a secondary transceiver 222 coupled to a secondary antenna 212, and a data processor/controller 280. Primary transceiver 220 includes a number (K) of receivers 230pa to 230pk and a number (K) of transmitters 250pa to 250pk to support multiple frequency bands, multiple radio technologies, carrier aggregation, etc. Secondary transceiver 222 includes a number (L) of receivers 230sa to 230sl and a number (L) of transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 (e.g., 230pa-230pk and 230sa-230sl) includes a low noise amplifier (LNA) 240 (e.g., 240pa-240pk and 240sa-240sl) and receive circuits 242 (e.g., 242pa-242pk and 242sa-242sl). For data reception, primary antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the down-converted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each remaining receiver 230 in primary transceiver 220 may operate in a similar manner as receiver 230pa. Receivers 230sa-230sl and associated antenna interface circuit 226 within secondary transceiver 222 may operate in a similar manner as receiver 230pa.

In the exemplary design shown in FIG. 2, each transmitter 250 (e.g. 250pa-250pk and 250sa-250sl) includes transmit circuits 252 (e.g. 252pa-252pk and 252sa-252sl) and a power amplifier (PA) 254 (e.g., 254pa-254pk and 254sa-254sl). For data transmission, data processor/controller 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via primary antenna 210. Each remaining transmitter 250 in transceivers 220 and 222 may operate in similar manner as transmitter 250pa.

Each receiver 230 and transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
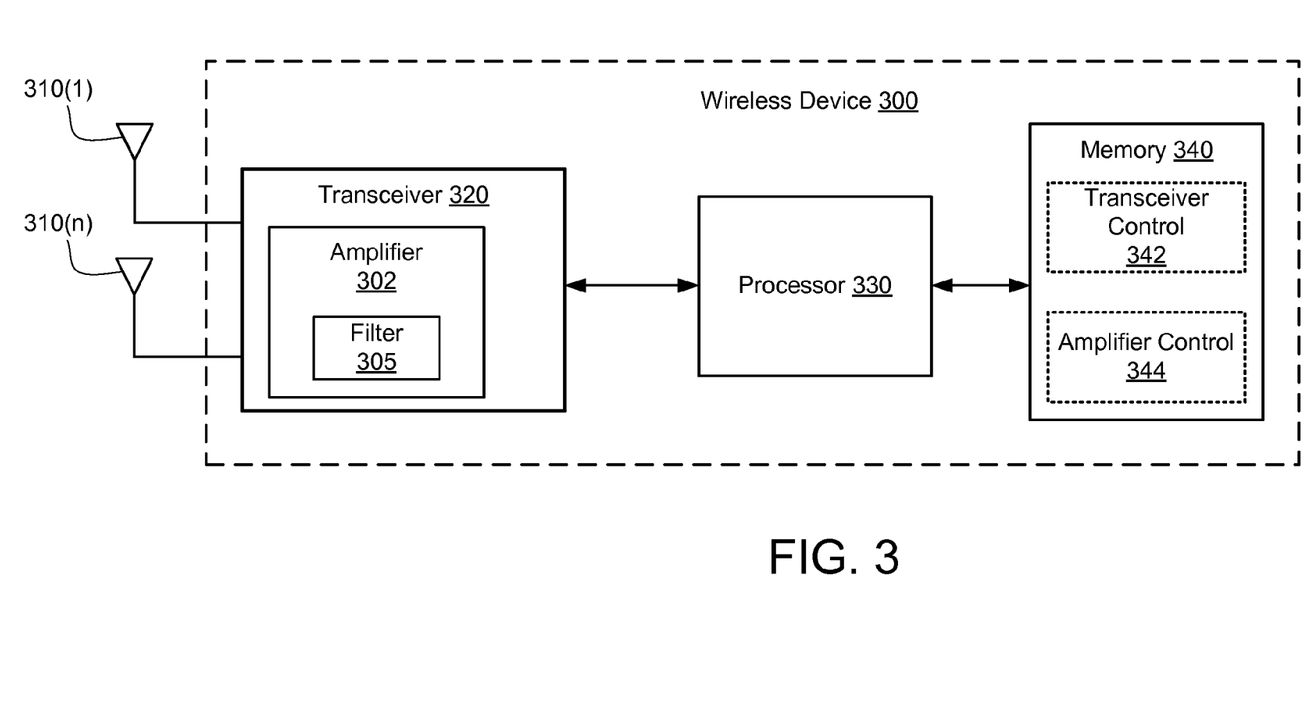
FIG. 3 depicts a wireless device that is another exemplary embodiment of the wireless device of FIG. 1.

FIG. 3 depicts a wireless device 300 that is another exemplary embodiment of wireless device 110 of FIG. 1. Wireless device 300 may include a plurality of antennas 310(1)-310(n), a transceiver 320, a processor 330, and a memory 340. Transceiver 320 may be one exemplary embodiment of primary transceiver 220 or secondary transceiver 222 of FIG. 2. Transceiver 320 may be coupled to antennas 310(1)-310(n), either directly or through an antenna selection circuit (not shown for simplicity). Transceiver 320 may be used to transmit signals and to receive signals from other wireless devices. Although not shown in FIG. 3, the transceiver 320 may include any number of transmit chains to process and transmit signals to other wireless devices via antennas 310(1)-310(n), and may include any number of receive chains to process signals received from antennas 310(1)-310(n). Thus, for exemplary embodiments, the wireless device 300 may be configured for multiple-input, multiple-output (MIMO) operations. The MIMO operations may include single-user MIMO (SU-MIMO) operations and multi-user MIMO (MU-MIMO) operations. In some exemplary embodiments, two or more transceivers may simultaneously transmit and/or receive RF signals through different frequency bands to implement carrier aggregation.

Transceiver 320 may include an amplifier 302. Amplifier 302 may be one exemplary embodiment of LNA 240 or PA 254 included within primary transceiver 220 and/or secondary transceiver 222. For example, amplifier 302 may amplify one or more RF signals transmitted and/or received through one of antennas 310(1)-310(n). In other exemplary embodiments, amplifier 302 may be any other technical feasible amplifier included within wireless device 300. Amplifier 302 may include a filter 305. In some exemplary embodiments, filter 305 may be a notch filter to attenuate one or more frequency bands included within RF signals amplified by amplifier 302. Operations of amplifier 302 and filter 305 are described in more detail below in conjunction with FIGS. 4-6.

Memory 340, coupled to processor 330, may include a non-transitory computer-readable storage medium (e.g., one or more nonvolatile memory elements, such as EPROM, EEPROM, Flash memory, a hard drive, etc.) that may store the following software (SW) modules:

- a transceiver control SW module 342 to control transmit and/or receive operations of transceiver 320; and
- an amplifier control SW module 344 to control operations associated with amplifier 302.

Each software module includes program instructions that, when executed by processor 330, may cause wireless device 300 to perform the corresponding function(s). Thus, the non-transitory computer-readable storage medium of memory 340 may include instructions for performing all or a portion of the operations of FIG. 7.

Processor 330, which is coupled to transceiver 320 and memory 340, may be any one or more suitable processors capable of executing scripts or instructions of one or more software programs stored in the wireless device 300 (e.g., within memory 340).

Processor 330 may execute transceiver control SW module 342 to select one or more frequency bands within which to operate transceiver 320. For example, transceiver control SW module 342 may select a 2.4 GHz frequency band and/or a 900 MHz frequency band to operate transceiver 320. In other exemplary embodiments, transceiver 320 may operate within other frequency bands.

Processor 330 may execute amplifier control SW module 344 to control amplifier 302 and, in some exemplary embodiments, control filter 305 within amplifier 302. For example, amplifier control SW module 344 may cause filter 305 to attenuate one or more frequency bands included within RF signals processed by transceiver 320.

Figure 4:
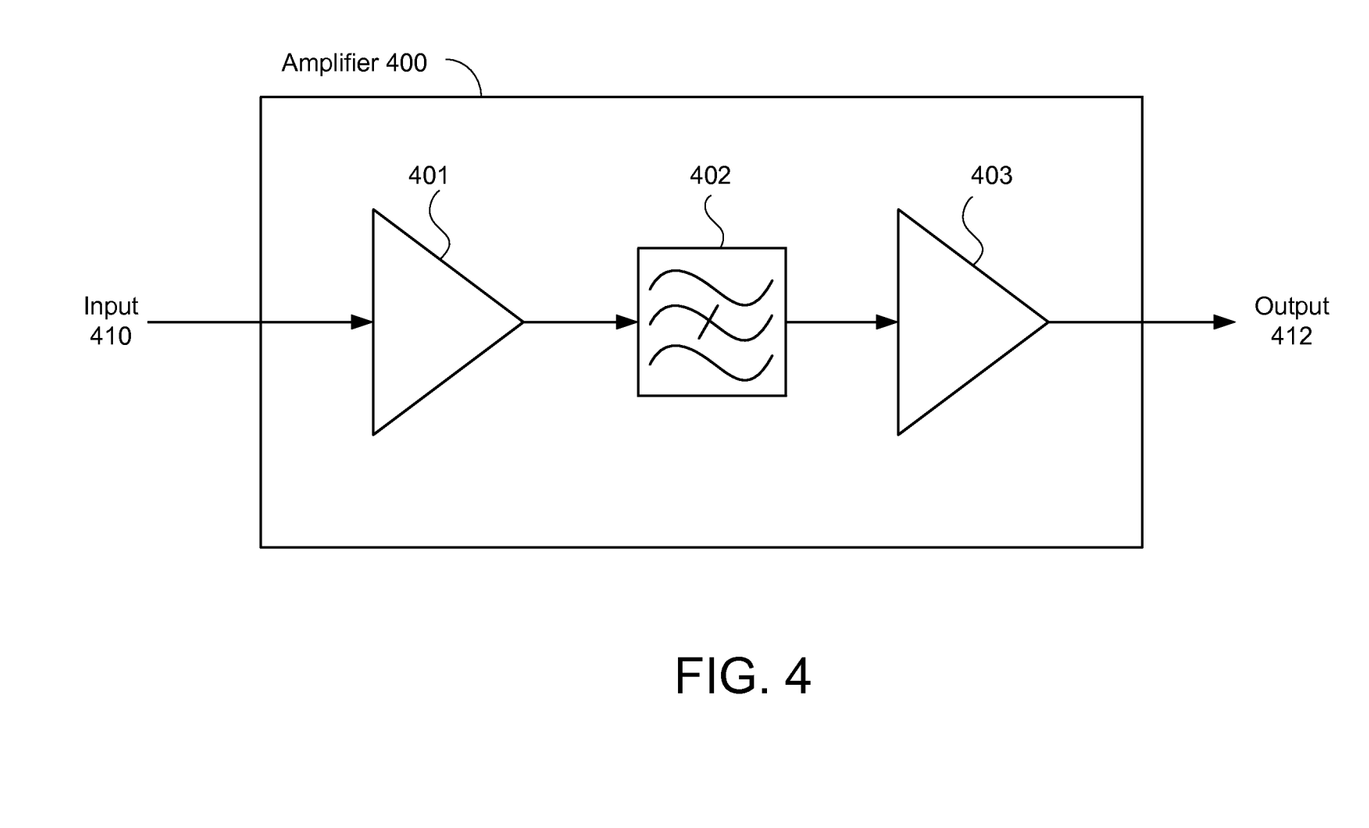
FIG. 4 shows a simplified block diagram of an amplifier, in accordance with exemplary embodiments.

FIG. 4 shows a simplified block diagram of an amplifier 400, in accordance with exemplary embodiments. Amplifier 400 may be one exemplary embodiment of LNA 240 or PA 254 included within primary transceiver 220 and/or secondary transceiver 222, or amplifier 302 in wireless device 300. Amplifier 400 may receive an input signal 410 and may generate an output signal 412 by amplifying the input signal 410. Although depicted as a single line segment, input signal 410 may be a single-ended signal or a differential signal. In a similar manner, output signal 412 may be a single-ended signal or a differential signal. In some exemplary embodiments, amplifier 400 may amplify signals that may include one or more undesired frequency components. For example, if input signal 410 is a clock signal, output signal 412 may include unwanted harmonics of the clock signal that may interfere with adjacent circuits within wireless device 110.

As shown, amplifier 400 may be a multi-stage amplifier and may include two or more gain stages. For the example of FIG. 4, amplifier 400 may include a first amplifier stage 401, a filter 402, and a second amplifier stage 403. In some exemplary embodiments, amplifier 400 may include other numbers of amplifier stages and more than one filter 402. In still other exemplary embodiments, filter 402 may be included within at least one of the amplifier stages included within amplifier 400. For example, filter 402 may be incorporated within first amplifier stage 401 and/or second amplifier stage 403.

Filter 402 may reduce (e.g., attenuate) one or more frequency bands associated with input signal 410 and/or output signal 412. For example, filter 402 may be a notch filter and may attenuate a frequency band included within output signal 412. In other exemplary embodiments, filter 402 may be a low-pass filter, a high-pass filter, or a band pass filter. In some exemplary embodiments, filter 402 may include an inductor-capacitor (LC) circuit to determine, at least in part, a frequency response associated with filter 402. For example, the LC circuit may determine which frequency bands may be attenuated when filter 402 is configured as a notch filter. In other exemplary embodiments, filter 402 may include other components and/or other circuits to determine the frequency response associated with filter 402. Example LC circuits are described in more detail below in conjunction with FIGS. 5A and 5B.

Figure 5A:
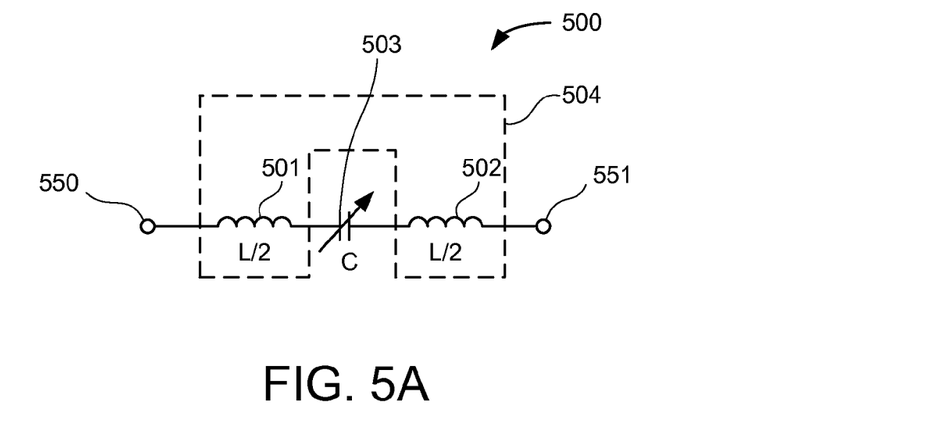
FIG. 5A is a schematic diagram of an inductor-capacitor circuit, in accordance with exemplary embodiments.

FIG. 5A is a schematic diagram of an LC circuit 500, in accordance with exemplary embodiments. LC circuit 500 may be included within filter 402 to determine frequencies (e.g., one or more frequency bands) to be attenuated through filter 402. Filter 402 may be another exemplary embodiment of filter 305. Thus, LC circuit 500 may determine, at least in part, the frequency response associated with filter 402. LC circuit 500 may include a first inductor 501, a capacitor 503, and a second inductor 502. In other exemplary embodiments, LC circuit 500 may include more than two inductors and more than one capacitor. First inductor 501, capacitor 503, and second inductor 502 may be coupled together serially such that capacitor 503 is disposed between first inductor 501 and second inductor 502. A first terminal 550 may be coupled to first inductor 501 and a second terminal 551 may be coupled to second inductor 502.

Capacitor 503 may have a capacitance value C. In some exemplary embodiments, capacitor 503 may be a variable capacitor having a variable capacitance value C. For example, capacitor 503 may be a varactor, a switched capacitor array, a microelectomechanical system (MEMS) capacitor, a diode-based variable capacitor, a metal oxide silicon (MOS) based variable capacitor, or any other technically feasible variable capacitor.

First inductor 501 and second inductor 502 may be sections of a shared differential inductor 504 (e.g., a differential inductance). An inductance value L may be divided between first inductor 501 and second inductor 502. In some exemplary embodiments, the inductance value L may be divided substantially evenly between first inductor 501 and second inductor 502 (e.g., first inductor 501 and second inductor 502 may each have a similar inductance value of approximately L/2).

LC circuit 500 may have an associated resonant frequency determined, at least in part, by inductance value L and capacitance value C. The resonant frequency may determine, at least in part, the frequency response of filter 402. In some exemplary embodiments, when RF signals that include frequencies at or near the resonant frequency of filter 402 are coupled to LC circuit 500, an impedance of the LC circuit 500 may approach zero, and LC circuit 500 may operate as a short circuit. In contrast, when RF signals that include frequencies far from the resonant frequency of filter 402 are coupled to LC circuit 500, the impedance of the LC circuit 500 may become relatively large, and LC circuit 500 may operate as an open circuit. Thus, the impedance associated with LC circuit 500 may be used in conjunction with one or more amplifier stages to selectively amplify (and/or selectively attenuate) frequencies near or far from the resonant frequency of filter 402.

Figure 5B:
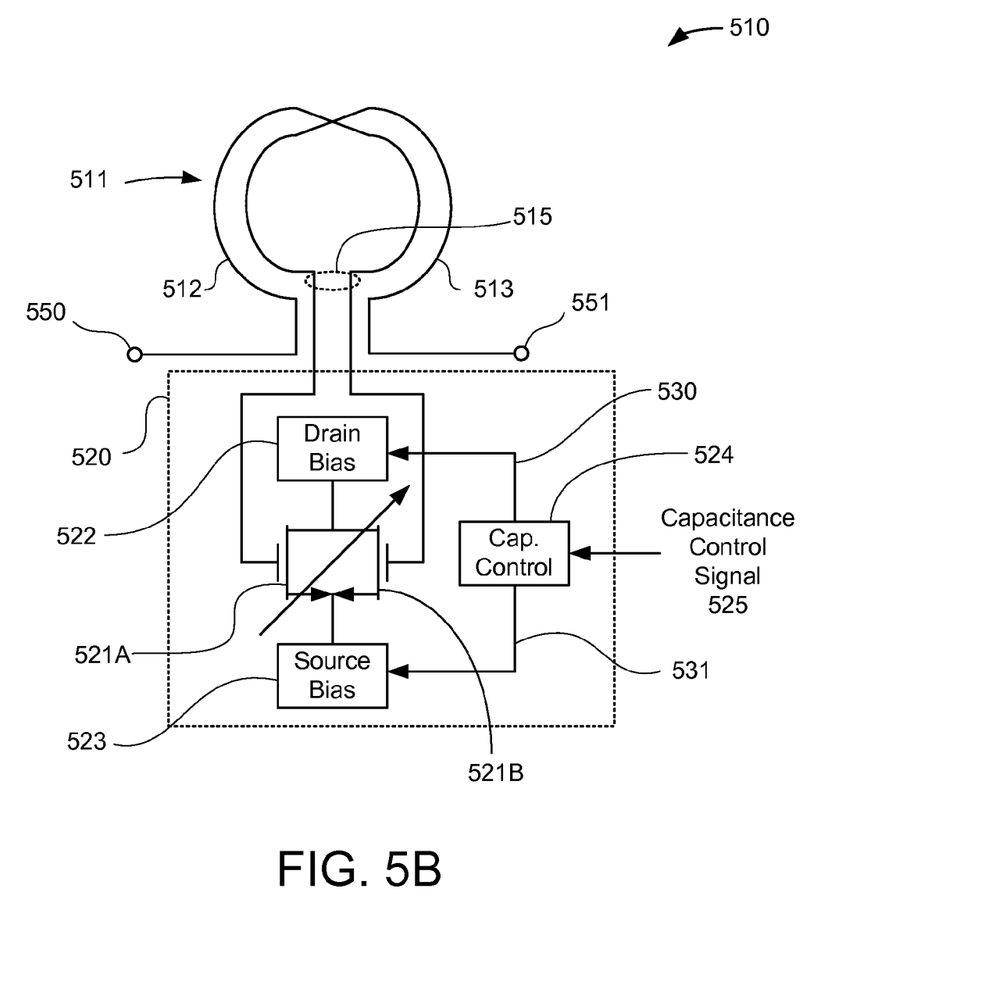
FIG. 5B is a block diagram of the inductor-capacitor circuit of FIG. 5A, in accordance with exemplary embodiments.

FIG. 5B is a block diagram 510 of LC circuit 500 of FIG. 5A, in accordance with exemplary embodiments. Block diagram 510 may include a first inductor 512, a second inductor 513, and a variable capacitor 520. First inductor 512 may be one exemplary embodiment of first inductor 501 of FIG. 5A, second inductor 513 may be one exemplary embodiment of second inductor 502 of FIG. 5A, and variable capacitor 520 may be one exemplary embodiment of capacitor 503 of FIG. 5A. First inductor 512 may be coupled to first terminal 550 and second inductor 513 may be coupled to second terminal 551.

In some exemplary embodiments, first inductor 512 and second inductor 513 may be a first inductor section and a second inductor section, respectively, of a differential inductor 511. Differential inductor 511 may be one exemplary embodiment of differential inductor 504 of FIG. 5A. Differential inductor 511 may be divided into two substantially equal inductors at or near a symmetry point 515. Symmetry point 515 (which may be referred to as a common-mode point) may be a point along differential inductor 511 that divides differential inductor 511 into substantially equal inductor sections. Thus, differential inductor 511 having an inductance value L may be divided at symmetry point 515 into first inductor 512 and second inductor 513 each having an inductance value L/2. Differential inductors may be associated with a relatively high quality (Q) factor, when compared to discrete, non-differential inductors. A resonant circuit having a relatively high quality factor may perform better compared to resonant circuits having a relatively low quality factor. For example, a resonant circuit with a relatively high quality factor may exhibit a lower rate of energy loss. In addition, oscillations within the resonant circuit may decay more slowly over time. In some exemplary embodiments, first inductor 512 may include a first conductive loop, and second inductor 513 may include a second conductive loop. The first conductive loop and the second conductive loop may be joined together at or near symmetry point 515. The first inductive loop may be inductively coupled with the second inductive loop.

Variable capacitor 520 may be coupled to differential inductor 511 via symmetry point 515. For example, differential inductor 511 may include two or more terminals at or near symmetry point 515 to couple to variable capacitor 520. In one exemplary embodiment, variable capacitor 520 may include MOS transistors 521A-521B, drain bias circuits 522, source bias circuits 523, and a capacitance control module 524.

Gate terminals of MOS transistors 521A-521B may operate as terminals of variable capacitor 520. In some exemplary embodiments, the capacitance of variable capacitor 520 may be determined by bias voltages and/or bias currents supplied to MOS transistors 521A-521B via drain bias circuits 522 and/or source bias circuits 523, respectively. For example, drain bias circuits 522 and source bias circuits 523 may include voltage sources, current sources, transistors, resistors and/or other components (not shown for simplicity) to determine bias voltages and/or bias currents for MOS transistors 521A-521B. Drain bias circuits 522 may be coupled to drain terminals of MOS transistors 521A-521B and source bias circuits 523 may be coupled to source terminals of MOS transistors 521A-521B.

Capacitance control module 524 may receive a capacitance control signal 525 to determine the capacitance value of variable capacitor 520. In response to capacitance control signal 525, capacitance control module 524 may drive drain bias control signals 530 and source bias control signals 531 to control drain bias circuits 522 and source bias circuits 523, respectively.

Figure 5C:
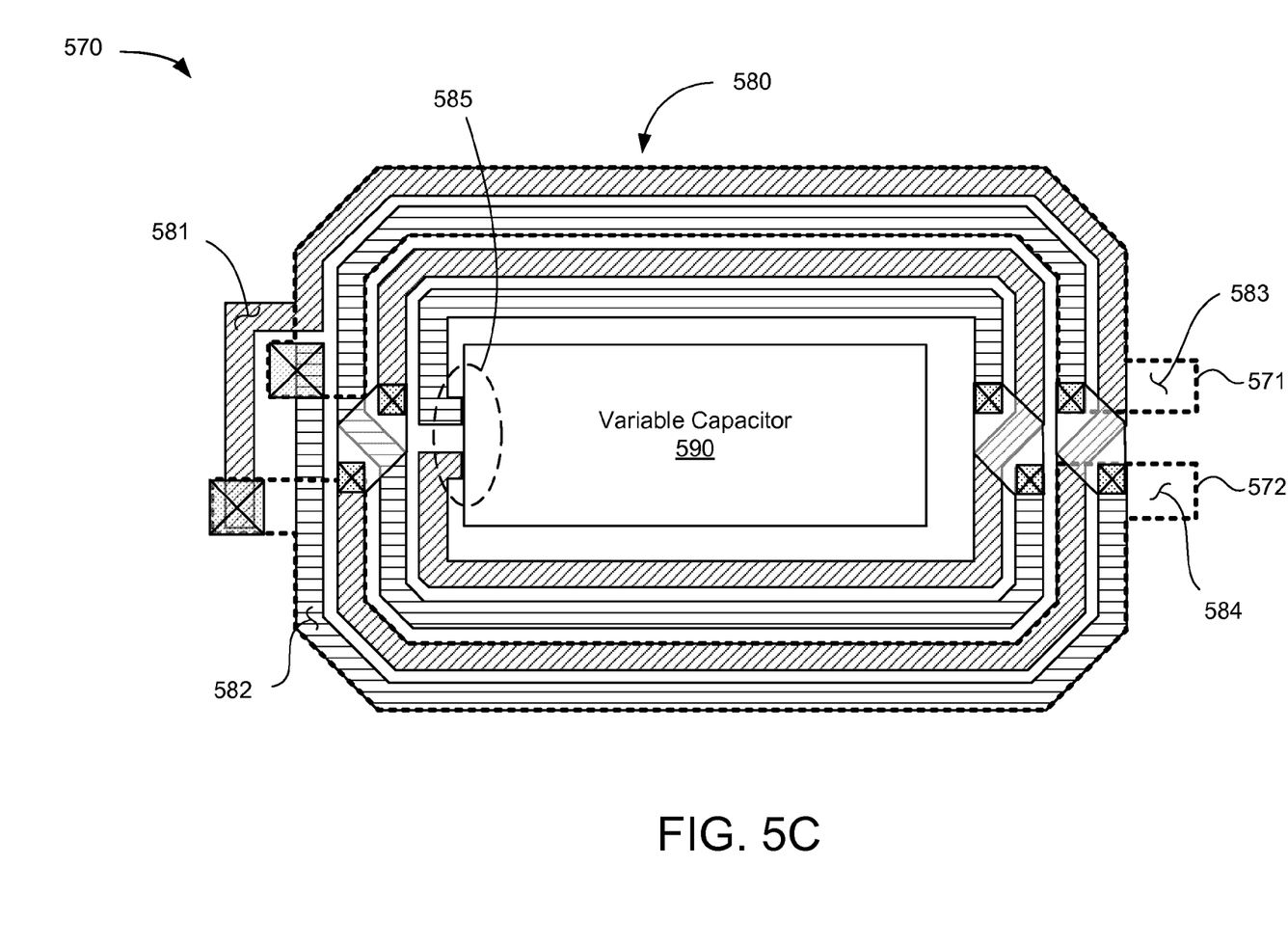
FIG. 5C depicts an exemplary layout of the inductor-capacitor circuit of FIG. 5A.

FIG. 5C depicts an exemplary layout 570 of LC circuit 500.

Layout 570 may include a differential inductor 580 and a variable capacitor 590. Differential inductor 580 may be another exemplary embodiment of differential inductor 511 and variable capacitor 590 may be another exemplary embodiment of variable capacitor 520. Differential inductor 580 may include a first inductor section 581, a second inductor section 582, a third inductor section 583, and a fourth inductor section 584. First inductor section 581 may be another exemplary embodiment of first inductor section 512 and second inductor section 582 may be another exemplary embodiment of second inductor section 513. Third inductor section 583 may include a first terminal 571, and fourth inductor section 584 may include a second terminal 572. First terminal 571 may be another embodiment of first terminal 550 and second terminal 572 may be another exemplary embodiment of second terminal 551.

First inductor section 581 may be coupled to fourth inductor section 584. In some exemplary embodiments, first inductor section 581 and fourth inductor section 584 may be disposed on different layers and coupled together by a via. In a similar manner, second inductor section 582 may be coupled to third inductor section 583 by another via. In some exemplary embodiments, first inductor section 581 and/or second inductor section 582 may include a plurality of separate segments coupled together with vias. Vias may be depicted in the accompanying figures as a box circumscribing an X.

Differential inductor 580 may include a symmetry point 585 (e.g., a common-mode point). In some exemplary embodiments, symmetry point 585 may divide differential inductor 580 into separate inductors, each inductor having a substantially similar inductance value. Thus, an inductance value of first inductor section 581 may be similar to an inductance value of second inductor section 582. In other exemplary embodiments, the inductance value of first inductor section 581 in combination with an inductance value of fourth inductor section 584 may be similar to the inductance value of second inductor section 582 in combination with an inductance value of third inductor section 583. Variable capacitor 590 may be coupled to differential inductor 580 via symmetry point 585.

Figure 6:
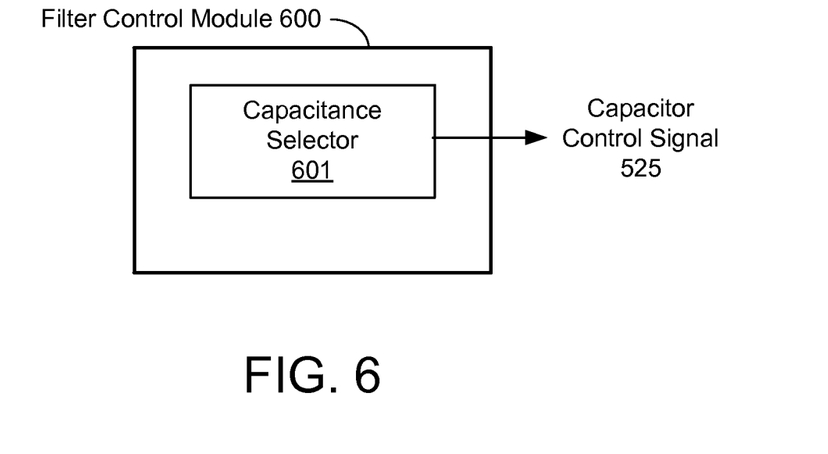
FIG. 6 is a block diagram of an exemplary filter control module, in accordance with exemplary embodiments.

FIG. 6 is a block diagram of an exemplary filter control module 600, in accordance with exemplary embodiments. Filter control module 600 may control, at least in part, a frequency response associated with filter 402. As described above with respect to FIG. 4, the resonant frequency of an LC circuit included within filter 402 may be associated with the frequency response of filter 402. Thus, filter control module 600 may control the frequency response of filter 402 by controlling the resonant frequency through variable capacitor 520 included within LC circuit 500.

In some exemplary embodiments, filter control module 600 may include a capacitance selector module 601. Capacitance selector module 601 may determine a desired capacitance for variable capacitor 520 based on a desired frequency response for filter 402. Capacitance selector module 601 may generate and drive capacitance control signal 525 to control variable capacitor 520 to generate the desired capacitance.

Figure 7:
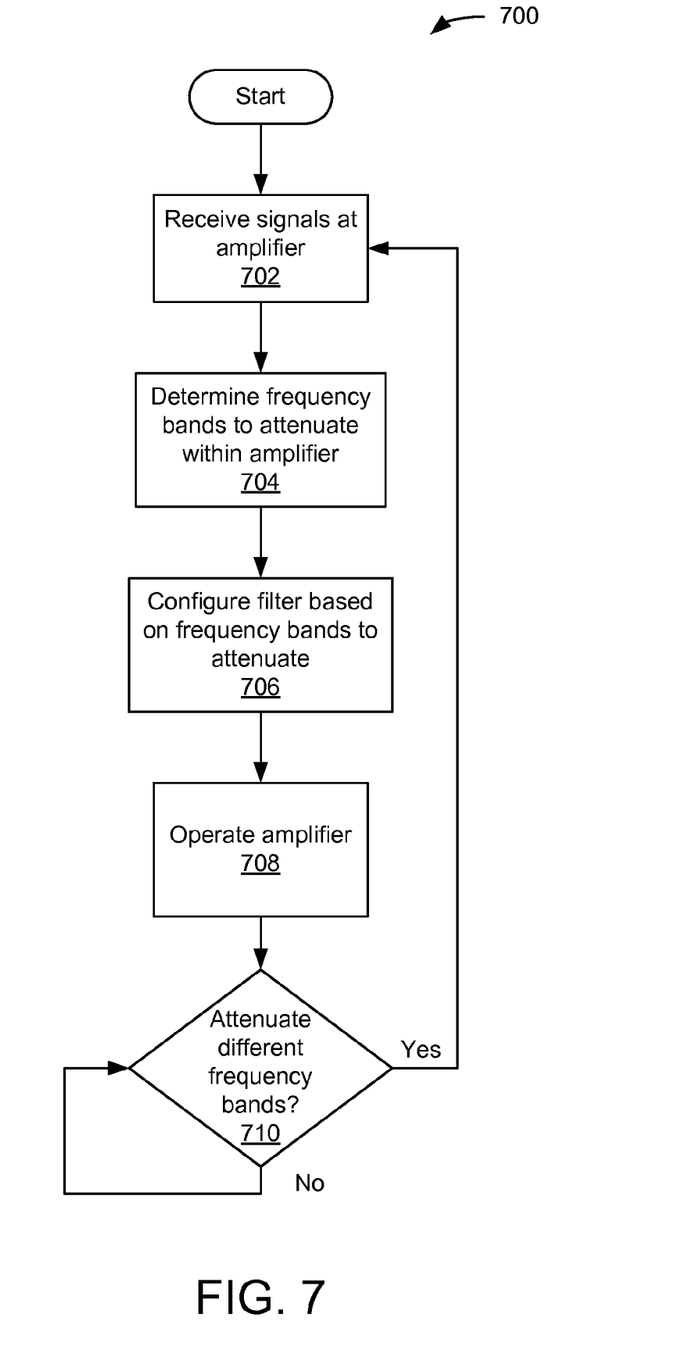
FIG. 7 shows an illustrative flow chart depicting an exemplary operation for the wireless device of FIG. 1, in accordance with exemplary embodiments.

FIG. 7 shows an illustrative flow chart depicting an exemplary operation 700 for wireless device 110, in accordance with exemplary embodiments. Some exemplary embodiments may perform the operations described herein with additional operations, fewer operations, operations in a different order, operations in parallel, and/or some operations differently. Referring also to FIGS. 3-6, signals are received at amplifier 302 (702). In some exemplary embodiments, the received signals may be one or more RF signals processed within transceiver 320.

Next, frequency bands to attenuate within amplifier 302 are determined (704). In some exemplary embodiments, wireless device 110 may transmit and/or receive RF signals within one or more frequency bands. Some frequencies within the RF signals may have been previously determined to interfere with one or more operations and/or circuit components within wireless device 110. For example, during a calibration phase, one or more interfering frequencies and/or frequency bands associated with predetermined RF signals may be identified. Thus, when amplifier 302 processes one of the predetermined RF signals, the interfering frequencies and/or frequency bands may be determined.

Next, filter 305 is configured for attenuation based on the determined frequency bands (706). In some exemplary embodiments, filter 305 may be configured by controlling a resonant frequency of LC circuit 500 included within filter 305 and/or amplifier 302. For example, filter control module 600 may drive capacitance control signal 525 to modify a capacitance value of variable capacitor 520, thereby modifying a related resonant frequency of LC circuit 500 included within filter 305.

Next, amplifier 302 is operated (708). For example, amplifier 302 may amplify an RF signal while filter 305 may attenuate a frequency band within the RF signal. Next, a determination of whether different frequency bands are to be attenuated is made (710). For example, if RF signals and/or frequency bands processed by transceiver 320 remain unchanged, then no change may be required for filter 305, and operations may return to 710. If, on the other hand, RF signals and/or frequency bands processed by transceiver 320 change, then operations proceed to 702.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media.

In the foregoing specification, the exemplary embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method, comprising:
 coupling, via a differential inductor, a first terminal to a second terminal, the differential inductor comprising a first inductor section, a second inductor section separate from the first inductor section, and a common-mode point; and
 tuning, via a variable capacitor, a resonant frequency associated with the differential inductor, wherein the variable capacitor is encircled by the differential inductor and serially directly connects the first inductor section to the second inductor section.

2. The method of claim 1, further comprising:
 coupling the first terminal to the common-mode point via the first inductor section of the differential inductor; and
 coupling the second terminal to the common-mode point via the second inductor section of the differential inductor.

3. An apparatus comprising:
 a differential inductor comprising a first inductor section, a second inductor section separate from the first inductor section, and a common-mode point; and
 a variable capacitor encircled by the differential inductor, wherein the variable capacitor is configured to serially directly connect the first inductor section to the second inductor section and tune a resonant frequency associated with the differential inductor.

4. The apparatus of claim 3, wherein the first inductor section has an inductance value substantially the same as the second inductor section.

5. The apparatus of claim 3, the variable capacitor comprising a plurality of metal oxide silicon (MOS) devices coupled to the common-mode point.

6. The apparatus of claim 3, the variable capacitor being from the group consisting of a microelectomechanical system (MEMS) capacitor, a varactor, a diode-based variable capacitor and a switched capacitor array.

7. The apparatus of claim 3, the variable capacitor comprising:
 a plurality of drain bias circuits; and
 a plurality of source bias circuits, the drain bias circuits and the source bias circuits configured to control a capacitance value associated with the variable capacitor.

8. The apparatus of claim 7, wherein the drain bias circuits and the source bias circuits are configured to control the capacitance value in response to a capacitance control signal.

9. The apparatus of claim 3, further comprising:
 a capacitance selector coupled to the variable capacitor and configured to control a capacitance value of the variable capacitor.

10. The apparatus of claim 9, wherein the capacitance selector is further configured to drive a capacitance control signal to the variable capacitor to control the capacitance value.

11. The apparatus of claim 3, wherein:
the first inductor section and the second inductor section are coupled to the common-mode point.

12. An apparatus comprising:
means for coupling a first terminal to a second terminal via a differential inductor comprising a first inductor section, a second inductor section separate from the first inductor section, and a common-mode point; and
means for tuning a resonant frequency associated with the differential inductor via a variable capacitor, the variable capacitor serially directly connecting the first inductor section to the second inductor section, wherein the means for tuning the resonant frequency is encircled by the means for coupling the first terminal to the second terminal.

13. The apparatus of claim 12, the means for coupling the first terminal to the second terminal comprising:
means for coupling the first terminal to the common-mode point via the first inductor section of the differential inductor; and
means for coupling the second terminal to the common-mode point via the second inductor section of the differential inductor.

14. The apparatus of claim 12, wherein an inductance value of the first inductor section of the differential inductor is substantially the same as the second inductor section of the differential inductor.

15. The apparatus of claim 12, the means for tuning the resonant frequency comprising:
means for generating a varying capacitance of the variable capacitor via a plurality of metal oxide silicon (MOS) devices.

16. The apparatus of claim 12, the means for tuning the resonant frequency comprising:
means for controlling a capacitance value of the variable capacitor via drain bias circuits and source bias circuits.

17. The apparatus of claim 16, the means for controlling the capacitance value comprising:
means for responding to a capacitance control signal.

18. The apparatus of claim 12, the means for tuning the resonant frequency comprising:
means for driving a capacitance control signal to tune the resonant frequency.

* * * * *